United States Patent
Liu et al.

(10) Patent No.: US 9,890,330 B2
(45) Date of Patent: Feb. 13, 2018

(54) SEMICONDUCTOR NANOCRYSTALS, METHOD FOR COATING SEMICONDUCTOR NANOCRYSTALS, AND PRODUCTS INCLUDING SAME

(71) Applicant: SAMSUNG ELECTRONICS CO., LTD., Suwon-si, Gyeongggi-do (KR)

(72) Inventors: Wenhao Liu, Billerica, MA (US); Peter M. Allen, Parsons, KS (US); Annie Cho Won, Somerville, MA (US); Zhiming Wang, Port Lavaca, TX (US); Craig A. Breen, Somerville, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/482,411

(22) Filed: Apr. 7, 2017

(65) Prior Publication Data

US 2017/0253799 A1 Sep. 7, 2017

Related U.S. Application Data

(63) Continuation of application No. 14/215,215, filed on Mar. 17, 2014, now Pat. No. 9,617,472.
(Continued)

(51) Int. Cl.
*H01L 29/06* (2006.01)
*C09K 11/88* (2006.01)
(Continued)

(52) U.S. Cl.
CPC ............ *C09K 11/883* (2013.01); *C09D 11/52* (2013.01); *C09K 11/025* (2013.01);
(Continued)

(58) Field of Classification Search
CPC .......... H01L 33/06; H01L 33/24; H01L 33/26
(Continued)

(56) References Cited

U.S. PATENT DOCUMENTS 3,760,000 A 9/1973 Curry
6,207,229 B1 3/2001 Bawendi et al.
(Continued)

FOREIGN PATENT DOCUMENTS

CN 101294071 10/2008
CN 102017147 4/2011
(Continued)

OTHER PUBLICATIONS

Bachmann, et al., "Temperature Quenching of Yellow Ce3+ Luminescence in YAG:Ce", Chem. Mater., (2009), vol. 21, pp. 2077-2084.
(Continued)

*Primary Examiner* — Matthew E Warren
(74) *Attorney, Agent, or Firm* — Cantor Colburn LLP

(57) ABSTRACT

A semiconductor nanocrystal that emits green light having a peak emission with a full width at half maximum of about 30 nm or less at 100° C. and a method of making coated semiconductor nanocrystals are provided. Materials and other products including semiconductor nanocrystals described herein and materials and other products including semiconductor nanocrystals prepared by a method described herein are also disclosed.

19 Claims, 2 Drawing Sheets

Related U.S. Application Data

(60) Provisional application No. 61/793,623, filed on Mar. 15, 2013.

(51) Int. Cl.
| | |
|---|---|
| C09D 11/52 | (2014.01) |
| C09K 11/02 | (2006.01) |
| C09K 11/56 | (2006.01) |
| H01L 33/06 | (2010.01) |
| H01L 33/24 | (2010.01) |
| H01L 33/26 | (2010.01) |

(52) U.S. Cl.
CPC ............ *C09K 11/565* (2013.01); *H01L 33/06* (2013.01); *H01L 33/24* (2013.01); *H01L 33/26* (2013.01)

(58) Field of Classification Search
USPC ..................................................... 257/13, 42
See application file for complete search history.

(56) References Cited

U.S. PATENT DOCUMENTS

| | | | |
|---|---|---|---|
| 6,322,901 B1 | 11/2001 | Bawendi et al. | |
| 6,607,829 B1 | 8/2003 | Bawendi | |
| 6,815,064 B2 | 11/2004 | Treadway et al. | |
| 7,229,497 B2 | 6/2007 | Stott et al. | |
| 7,615,800 B2 | 11/2009 | Kahen | |
| 7,767,260 B2 | 8/2010 | Peng et al. | |
| 7,777,233 B2 | 8/2010 | Kahen et al. | |
| 7,824,731 B2 | 11/2010 | Ying et al. | |
| 7,855,091 B1 | 12/2010 | Kar et al. | |
| 8,980,133 B2 | 3/2015 | Ramprasad | |
| 9,136,428 B2 | 9/2015 | Clough et al. | |
| 9,139,435 B2 | 9/2015 | Breen et al. | |
| 2003/0145779 A1 | 8/2003 | Alivisatos et al. | |
| 2004/0110002 A1 | 6/2004 | Kim et al. | |
| 2004/0178390 A1 | 9/2004 | Whiteford et al. | |
| 2006/0110279 A1 | 5/2006 | Hau et al. | |
| 2006/0170331 A1 | 8/2006 | Bertram et al. | |
| 2007/0170418 A1 | 7/2007 | Bowers et al. | |
| 2007/0201056 A1 | 8/2007 | Cok et al. | |
| 2007/0295266 A1 | 12/2007 | Lee et al. | |
| 2008/0012031 A1 | 1/2008 | Jang et al. | |
| 2008/0084706 A1 | 4/2008 | Roshan et al. | |
| 2008/0118755 A1 | 5/2008 | Whiteford et al. | |
| 2008/0188063 A1 | 8/2008 | Alivisatos et al. | |
| 2008/0220593 A1 | 9/2008 | Pickett et al. | |
| 2008/0264473 A1 | 10/2008 | Cumpston et al. | |
| 2008/0268248 A1 | 10/2008 | Jang et al. | |
| 2008/0296144 A1 | 12/2008 | Strouse et al. | |
| 2008/0316576 A1 | 12/2008 | Molenkamp et al. | |
| 2009/0162011 A1 | 6/2009 | Coe-Sullivan et al. | |
| 2009/0203196 A1 | 8/2009 | Kim et al. | |
| 2009/0217970 A1 | 9/2009 | Zimmerman et al. | |
| 2009/0278141 A1 | 11/2009 | Coe-Sullivan et al. | |
| 2009/0302304 A1 | 12/2009 | Peng et al. | |
| 2010/0052512 A1 | 3/2010 | Clough et al. | |
| 2010/0062154 A1* | 3/2010 | Shin ..................... C01B 19/007 427/214 | |
| 2010/0108530 A1 | 5/2010 | Zehnder et al. | |
| 2010/0140586 A1 | 6/2010 | Char et al. | |
| 2010/0163800 A1 | 7/2010 | Peng et al. | |
| 2010/0258789 A1 | 10/2010 | Akai et al. | |
| 2010/0264371 A1 | 10/2010 | Nick | |
| 2010/0265307 A1 | 10/2010 | Linton et al. | |
| 2010/0283014 A1 | 11/2010 | Breen et al. | |
| 2010/0283036 A1 | 11/2010 | Coe-Sullivan et al. | |
| 2010/0283072 A1 | 11/2010 | Kazlas | |
| 2010/0289003 A1 | 11/2010 | Kahen et al. | |
| 2010/0289044 A1 | 11/2010 | Krames et al. | |
| 2010/0308272 A1 | 12/2010 | Peng et al. | |
| 2011/0031452 A1 | 2/2011 | Krauss et al. | |
| 2011/0052918 A1 | 3/2011 | Krauss et al. | |
| 2011/0080090 A1 | 4/2011 | Wood et al. | |
| 2011/0081538 A1 | 4/2011 | Linton | |
| 2011/0103055 A1 | 5/2011 | Carroll | |
| 2011/0103064 A1 | 5/2011 | Coe-Sullivan et al. | |
| 2011/0186811 A1 | 8/2011 | Coe-Sullivan et al. | |
| 2011/0212561 A1 | 9/2011 | Banin et al. | |
| 2011/0220194 A1 | 9/2011 | Kurtin et al. | |
| 2011/0220844 A1 | 9/2011 | Tulsky et al. | |
| 2011/0226991 A1 | 9/2011 | Treadway et al. | |
| 2011/0229397 A1 | 9/2011 | Bartel et al. | |
| 2011/0233468 A1 | 9/2011 | Zong et al. | |
| 2011/0260111 A1 | 10/2011 | Nie et al. | |
| 2011/0262752 A1 | 10/2011 | Bawendi et al. | |
| 2011/0278536 A1 | 11/2011 | Walker et al. | |
| 2011/0309238 A1 | 12/2011 | Tian et al. | |
| 2011/0309325 A1 | 12/2011 | Park et al. | |
| 2012/0018675 A1 | 1/2012 | Okuyama et al. | |
| 2012/0049119 A1 | 3/2012 | Greytak et al. | |
| 2012/0113671 A1 | 5/2012 | Sadasivan et al. | |
| 2012/0175588 A1 | 7/2012 | Qiao et al. | |
| 2012/0187367 A1 | 7/2012 | Modi et al. | |
| 2012/0189791 A1 | 7/2012 | Modi et al. | |
| 2012/0250351 A1 | 10/2012 | Shin et al. | |
| 2012/0256141 A1 | 10/2012 | Nick et al. | |
| 2013/0026506 A1 | 1/2013 | Arbell | |
| 2013/0048946 A1 | 2/2013 | Jang et al. | |
| 2013/0148376 A1 | 6/2013 | Nick et al. | |
| 2013/0169904 A1 | 7/2013 | Kang et al. | |
| 2013/0175514 A1 | 7/2013 | Han et al. | |
| 2013/0240787 A1 | 9/2013 | Chen et al. | |
| 2014/0049155 A1 | 2/2014 | Kurtin | |
| 2014/0198142 A1 | 7/2014 | Whitehead et al. | |
| 2014/0334181 A1 | 11/2014 | Hu et al. | |
| 2015/0003043 A1 | 1/2015 | Ke | |
| 2015/0013589 A1 | 1/2015 | Liu et al. | |
| 2015/0014586 A1 | 1/2015 | Liu et al. | |
| 2015/0014629 A1 | 1/2015 | Breen et al. | |
| 2015/0021521 A1 | 1/2015 | Nick et al. | |
| 2015/0021548 A1 | 1/2015 | Liu et al. | |
| 2015/0021551 A1 | 1/2015 | Breen et al. | |
| 2015/0171268 A1 | 6/2015 | Breen et al. | |
| 2016/0004124 A1* | 1/2016 | Benoit .............. G02F 1/133603 349/69 | |

FOREIGN PATENT DOCUMENTS

| | | |
|---|---|---|
| WO | 2008063658 | 5/2008 |
| WO | 2009014590 | 1/2009 |
| WO | 2009120688 | 10/2009 |
| WO | 2009137053 | 11/2009 |
| WO | 2009145813 | 12/2009 |
| WO | 2009151515 | 12/2009 |
| WO | 2010129350 | 11/2010 |
| WO | 2010129374 | 11/2010 |
| WO | 2011031871 | 3/2011 |
| WO | 2012021643 | 2/2012 |
| WO | 2013078242 | 5/2013 |
| WO | 2013078245 | 5/2013 |
| WO | 2013078247 | 5/2013 |
| WO | 2013078249 | 5/2013 |
| WO | 2013078251 | 5/2013 |
| WO | 2013078252 | 5/2013 |
| WO | 2013115898 | 8/2013 |
| WO | 2013162646 | 10/2013 |

OTHER PUBLICATIONS

Chang et al., "Synthesis and Photoluminescence Charateristics of High Color Purity and Brightness Li3Ba2Gd3(MoO4)8:Eu3+ Red Phosphors", J. Phys. Chem. C, (2010), vol. 114, pp. 3645-3652.
Chinese Office Action dated Apr. 22, 2016 in CN Application No. 2012800722539, which is the Chinese counterpart of related US Appl. No. 14/451,125.
Chinese Search Report dated Apr. 13, 2016 in CN Application No. 2012800722539, which is the Chinese counterpart of related U.S. Appl. No. 14/451,125.

(56) References Cited

OTHER PUBLICATIONS

Cumberland, et al., "Inorganic Clusters as Single-Source Precursors for Preparation of CdSe, ZnSe, and CdSe/ZnS Nanomaterials", Chem. Mater., (2002), vol. 14, pp. 1576-1584.
Dabbousi, et al., "(CdSe) ZnS Core-Shell Quantum Dots; Synthesis and Characterization of a Size Series of Highly Luminescent Nanocrystallites", J. Phys. Chem., (1997), vol. 101, pp. 9463.
deMello et al., "An Improved Experimental Determination of External Photoluminescence Quantum Efficiency", Adv. Mater., (1997), vol. 9(3), p. 230.
Dukes, et al., "Luminescent Quantum Dots", ECS Transactions, (2011), vol. 33, pp. 3-16.
Gindele, et al., "Phonon interaction of single excitons and biexcitons", Phys. Rev. B., (1999), vol. 60, R2157 (R).
Gong, "Synthesis, optical properties, and surface modification of magic-size semiconductor nanocrystals, nanowires and nanoplatelets", San Diego State University, (2011), <http://sdsudspace.calstate.edu/handle/10211.10/1438>.
Hines, et al., "Synthesis and Characterization of Strongly Luminescing ZnS-Capped CdSe Nanocrystals", J. Phys. Chem., (1996), vol. 100, pp. 468-471.
Jiao, et al., "Measurement and Analysis of Temperature-Dependent Optical Modal Gain in Single-Layer InAs/InP (100) Quantum-Dot Amplifiers in the 1.6-to 1.8-um Wavelength Range", IEEE Photonics Journal, (2012), vol. 4, No. 6, pp. 2292-2306.
Jing, et al., "Temperature-Dependent Photoluminescence of CdSe-Core CdS/GdZnS/ZnS-Multishell Quantum Dots", J. Phys. Chem C, (2009), vol. 113, pp. 13545-13550.
Kim, S., "Assembly and Control of Light-Emitting Nanostructures for Near-Field Imaging", NNIN REU Research Accomplishments, (2008), pp. 136-137.
Koole et al., "Paramagnetic lipid-coated silica nanoparticles with a fluorescent quantum dot core: a new contrast agent platform for multimodality imaging", Bioconjugate Chemistry, (2008), vol. 19, No. 12, pp. 2471-2479.
Lu et al., "Temperature-dependent photoluminescence in light-emiiting diodes", (2014), vol. 4:6131, pp. 1-7, <www.nature.com/scientificreports>.
Morello, et al., Temperature and size dependence of Nonradiative Relaxation and Exciton-Phonon Coupling in Colloidal CdTe Quantum Dots, J. Phys. Chem C, (2007), vol. 111, pp. 5846-5849.
Murray, C., et al., "Synthesis and Characterization of Monodisperse Nanocrystals and Close-Packed Nanocrystals Assemblies", Annu. Rev. Mater. Sci, (2000), vol. 30, pp. 545-610.
Murray, C., et al., "Synthesis and Characterization of Nearly Monodisperse CdE (E = S, Se, Te) Semiconductor Nanocrystallites", J. Am. Chem. Soc., (Nov. 1993), J. Am. Chem. Soc., vol. 115, pp. 8706-8715.
Murray, C.B., "Synthesis and Characterization of II-VI Quantum Dots and Their Assembly into 3-D Quantum Dot Superlattices", (Sep. 1995), Massachusetts Institute of Technology.
Nexxus Lighting Delivers First Commercially-Available Quantum Dot-LED Replacement Light Bulbs. LED Professional, (Mar. 12, 2010), <http://www.led-professional.com/products/led-lamps/nexxus-lighting-delivers-first-commercially-available-quantum-dot-led-replacement-light-bulbs>.
Office Action dated Jun. 1, 2016 mailed in related U.S. Appl. No. 14/451,125.
Peng et al., "Formation of High-Quality CdTe, CdSe, and CdS Nanocrystals Using CdO as Precursor", J. Am. Chem. Soc., (2001), vol. 123, pp. 183-184.
Peng, Z., et al., "Mechanism of the Shape Evolution of CdSe Nanocrystals", J. Am. Chem. Soc., (2001), vol. 123, pp. 1389-1395.
QLED Technology, QD Vision, (Oct. 18, 2010), retrieved from the Internet <http://web.archive.org/web/201018132134://http://www.qdvision.com/qled-technology>.
Qu et al., "Alternative Routes Toward High Quality CdSe Nanocrystals", Nano Lett., (2001), vol. 1, No. 6, pp. 333-337.
Quantum Dots begin to impact backlightand general illumination applications. LEDs Magazine, (Feb. 9, 2010), <http://ledsmagazine.com/news/7/2/12>.
Reiss et al., "Core/Shell Semiconductor Nanocrystals", small, (2009), vol. 5, No. 2, pp. 154-168.
Seravalli, et al., "Quantum dot strain engineering for light emission at 1.3, 1.4 and 1.5" Appl. Phys. Lett., (2005), vol. 87, 063101, (pp. 3).
Valerini et al., "Temperature dependence of the photoluminescence properties of colloidal CdSe/ZnS core/shell quantum dots embeded in a polystyrene matrix" Phys. Rev. B, (2005), vol. 71, 235409.
Wang et al., "Temperature dependent photoluminescence investigation of AlGaAs/GaAs quantum wires grown by flow rate modulation epitaxy", Appl. Phys. Lett. (1995), vol. 67, No. 24, pp. 3629-3631.
Woo et al., "Thermal behavior of a quantum dot nanocomposite as a color converting material and its application to white LED", Nanotechnology (2010), vol. 21, No. 49, 495704.
Zhao, W-R., et al., "Temperature Dependence of Emission Properties of Self-Assembled InGaN Quantum Dots", Chin. Phys. Lett., vol. 31, No. 11 (2014), pp. 114205.
Zhou et al., "Temperature-dependent photoluminescence properties of Mn:ZnCuInS nanocrystals", Optical Materials Express, (2015), vol. 5, No. 9, (pp. 12).

* cited by examiner

SEMICONDUCTOR NANOCRYSTALS, METHOD FOR COATING SEMICONDUCTOR NANOCRYSTALS, AND PRODUCTS INCLUDING SAME

CLAIM OF PRIORITY

This application claims is a continuation of U.S. patent application Ser. No. 14/215,215 filed on Mar. 17, 2014, which claims priority to U.S. Provisional Patent Application No. 61/793,623, filed on 15 Mar. 2013, which is hereby incorporated herein by reference in its entirety for all purposes.

TECHNICAL FIELD OF THE INVENTION

The present invention relates to semiconductor nanocrystals, also referred to as quantum dots, methods of coating or providing layers or shells on quantum dots, and products including same.

SUMMARY OF THE INVENTION

The present invention relates to semiconductor nanocrystals, a method for overcoating semiconductor nanocrystals, materials and products including semiconductor nanocrystals taught herein, and materials and products including semiconductor nanocrystals made by a method taught herein.

In accordance with one aspect of the present invention, there is provided a semiconductor nanocrystal that emits green light having a peak emission with a full width at half maximum of about 30 nm or less.

A semiconductor nanocrystal in accordance with the present invention can emit green light having a peak emission with a full width at half maximum of about 30 nm or less at 100° C.

A semiconductor nanocrystal in accordance with the present invention can emit green light having a peak emission with a full width at half maximum of about 30 nm or less at room temperature (e.g., about 25° C.).

A semiconductor nanocrystal in accordance with the present invention can include a core and one or more coatings or shells over at least a portion of the core.

Selection of the materials and structure of a semiconductor nanocrystal may be made to alter the emitting characteristics of the resulting core-shell quantum dot. Examples of materials include inorganic semiconductor materials.

A coating can further include one or more layers.

Selection of the materials for the one or more coatings or layers or shells of the same or different material may be made to alter the emitting characteristics of the resulting core-shell quantum dot. Examples of materials include inorganic semiconductor materials.

A first coating can comprise one or more Group IIB elements (e.g., Zn, Cd, Hg) and one or more Group VIA elements (e.g., O, S, Se, Te).

A first coating comprising zinc, sulfur, and selenium can be preferred.

A second coating can comprise one or more Group IIB elements (e.g., Zn, Cd, Hg) and one or more Group VIA elements (e.g., O, S, Se, Te).

A second coating comprising cadmium, zinc, and sulfur can be preferred.

Examples of a semiconductor nanocrystal of the present invention include a semiconductor nanocrystal including a core comprising cadmium and selenium, a first coating comprising zinc, sulfur, and selenium disposed over at least a portion of the core, and a second coating comprising cadmium, zinc, and sulfur disposed over at least a portion of the first coating, the nanocrystal emitting green light having a peak emission with a full width at half maximum of about 30 nm or less at 100° C.

A semiconductor nanocrystal in accordance with the present invention that is free or substantially free of amine species at the surface, whether the amine species is free, unreacted or unbound or as bound ligands, can be preferred. For example, such particles, when used in a matrix that is subjected to light flux conditions, e.g., in excess of 1 W/cm$^2$ and/or temperature conditions >100° C., for example, advantageously inhibit, reduce or lower yellowing, browning or discoloration of the quantum dot matrix.

Embodiments of a semiconductor nanocrystal in accordance with the present invention can exhibit a solid state external quantum efficiency of at least 90% at a temperature of 90° C. or above. For example, a semiconductor nanocrystal in accordance with the present invention can have a solid state external quantum efficiency of at least 90% at a temperature of 100° C., a semiconductor nanocrystal in accordance with the present invention can have a solid state external quantum efficiency of at least 95% at a temperature of 90° C. or above; a semiconductor nanocrystal in accordance with the present invention can have a solid state external quantum efficiency of at least 95% at a temperature of 100° C.

In accordance with another aspect of the present invention, there is provided a method of making coated semiconductor nanocrystals, the method comprising:

providing a first reaction mixture comprising core semiconductor nanocrystals in a solvent at a first temperature of greater than 240° C.;

adding zinc carboxylate and a mixture of sulfur and selenium sources to the first reaction mixture including the core semiconductor nanocrystals to form first coated semiconductor nanocrystals; and adding one or more metal carboxylates and one or more chalcogenide sources to the first coated semiconductor nanocrystals at a second temperature of greater than 300° C. forming a second coating over the first coated semiconductor nanocrystals.

The first and second coatings are preferably formed in the absence or substantial absence of amine species.

A semiconductor nanocrystal or quantum dot that is coated with a first coating using a method taught herein may also be referred to as a "core" particle, a "core" semiconductor nanocrystal, or a "core" quantum dot.

In accordance with a still further aspect of the present invention, there is provided a composition including at least one quantum dot described herein. The composition can further include a host material.

In accordance with a still further aspect of the present invention, there is provided a light emitting material comprising at least one quantum dot described herein. The light-emitting material can further include a host material.

In accordance with a still further aspect of the present invention, there is provided an optical material comprising at least one quantum dot described herein. The optical material can further include a host material.

In accordance with a still further aspect of the present invention, there is provided an optical component including at least one quantum dot described herein.

In accordance with a still further aspect of the present invention, there is provided a backlighting unit including at least one quantum dot described herein.

In accordance with a still further aspect of the present invention, there is provided a display including at least one quantum dot described herein.

In accordance with a still further aspect of the present invention, there is provided a light-emitting device including at least one quantum dot described herein.

In accordance with a still further aspect of the present invention, there is provided a composition including at least one quantum dot prepared by a method in accordance with the present invention. The composition can further include a host material.

In accordance with a still further aspect of the present invention, there is provided a light emitting material comprising at least one quantum dot prepared by a method in accordance with the present invention. The light-emitting material can further include a host material.

In accordance with a still further aspect of the present invention, there is provided an optical material comprising at least one quantum dot prepared by a method in accordance with the present invention. The optical material can further include a host material.

In accordance with a still further aspect of the present invention, there is provided an optical component including at least one quantum dot prepared by a method in accordance with the present invention.

In accordance with a still further aspect of the present invention, there is provided a backlighting unit including at least one quantum dot prepared by a method in accordance with the present invention.

In accordance with a still further aspect of the present invention, there is provided a display including at least one quantum dot prepared by a method in accordance with the present invention.

In accordance with a still further aspect of the present invention, there is provided a light-emitting device including at least one quantum dot prepared by a method in accordance with the present invention.

In various aspects and embodiments of the inventions described herein, the quantum dot core and shells are undoped.

In various aspects and embodiments of the inventions described herein, a quantum dot described herein can be included in a device, component, or product in the form of a composition in which it is included.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
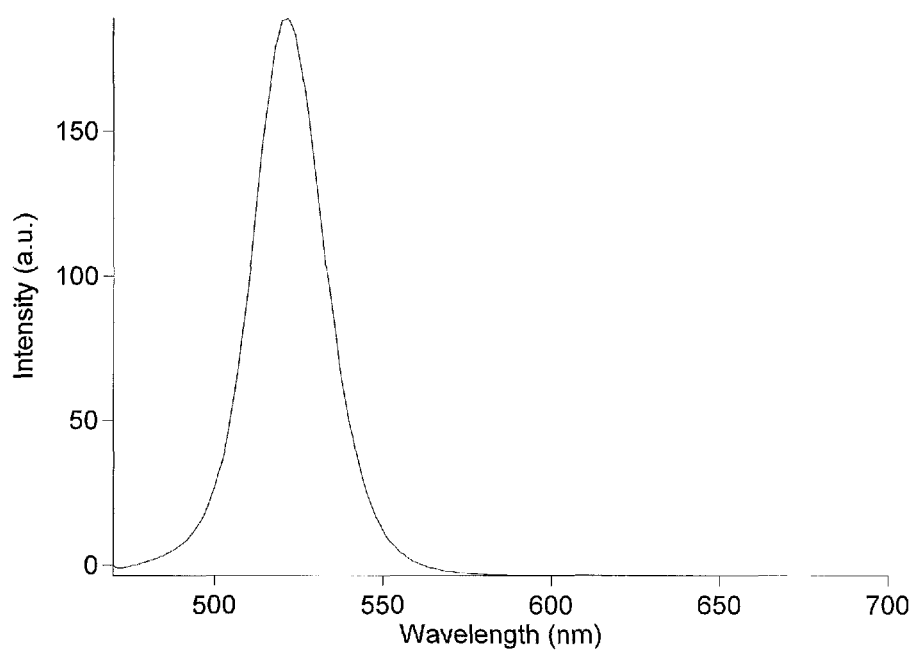
FIG. 1 graphically depicts an emission spectrum of an example of a semiconductor nanocrystal of the present invention.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

The present invention relates to semiconductor nanocrystals, a method of coating core quantum dots with two or more coatings, products including semiconductor nanocrystals in accordance with the present invention, and products including semiconductor nanocrystals prepared by a method in accordance with the method of the present invention.

In accordance with one aspect of the present invention, there is provided a semiconductor nanocrystal that emits green light having a peak emission with a full width at half maximum of about 30 nm or less.

A semiconductor nanocrystal in accordance with the present invention can emit green light having a peak emission with a full width at half maximum of about 30 nm or less at 100° C.

A semiconductor nanocrystal in accordance with the present invention can emit green light having a peak emission with a full width at half maximum of about 30 nm or less at room temperature (e.g., about 25° C.).

A semiconductor nanocrystal in accordance with the present invention can include a core and one or more coatings or shells over at least a portion of the core.

A core can comprise an inorganic semiconductor material. For example, but without limitation, a core can comprise one or more Group IIB elements and one or more Group VIA elements. A core comprising cadmium and selenium (e.g., CdSe) can be preferred.

A coating or shell can further include one or more layers. Selection of the materials for the one or more coatings or layers or shells of the same or different material may be made to alter the emitting characteristics of the resulting core-shell quantum dot. Examples of materials include inorganic semiconductor materials.

A first coating can comprise one or more Group IIB elements (e.g., Zn, Cd, Hg) and one or more Group VIA elements (e.g., O, S, Se, Te).

A first coating comprising zinc, sulfur, and selenium can be preferred.

A second coating can comprise one or more Group IIB elements (e.g., Zn, Cd, Hg) and one or more Group VIA elements (e.g., O, S, Se, Te).

A second coating comprising cadmium, zinc, and sulfur can be preferred. For example, a second coating can comprise $Cd_xZn_{1-x}S$ (wherein $0<x<1$).

Examples of a semiconductor nanocrystal of the present invention include a semiconductor nanocrystal including a core comprising cadmium and selenium, a first coating comprising zinc, sulfur, and selenium disposed over at least a portion of the core, and a second coating comprising cadmium, zinc, and sulfur disposed over at least a portion of the first coating, the nanocrystal emitting green light having a peak emission with a full width at half maximum of about 30 nm or less at 100° C.

A semiconductor nanocrystal in accordance with the present invention that is free or substantially free of amine species at the surface, whether the amine species is free, unreacted or unbound or as bound ligands, can be preferred. For example, such particles, when used in a matrix that is subjected to light flux conditions, e.g., in excess of 1 W/cm$^2$ and/or temperature conditions >100° C., for example, advantageously inhibit, reduce or lower yellowing, browning or discoloration of the quantum dot matrix.

A semiconductor nanocrystal in accordance with the present invention can exhibit thermal stability. For example, a semiconductor nanocrystal in accordance with the present invention can have a solid state external quantum efficiency of at least 90% at a temperature of 90° C. or above. For example, a semiconductor nanocrystal in accordance with the present invention can have a solid state external quantum efficiency of at least 90% at a temperature of 100° C., a semiconductor nanocrystal in accordance with the present invention can have a solid state external quantum efficiency of at least 95% at a temperature of 90° C. or above; a semiconductor nanocrystal in accordance with the present invention can have a solid state external quantum efficiency of at least 95% at a temperature of 100° C.

Semiconductor nanocrystals or quantum dots (which also may be referred to herein as semiconductor nanoparticles) are nanometer sized semiconductor particles that can have optical properties arising from quantum confinement. Quantum dots can have various shapes, including, but not limited to a sphere, rod, disk, other shapes, and mixtures of various shaped particles. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, Annual Review of Material Sci., 2000, 30: 545-610 hereby incorporated by reference in its entirety. The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

Exemplary quantum dots include, for example, quantum dots comprising a semiconductor material that can be represented by the formula MX, wherein M represents one or more metals and X represents one or more chalcogens and/or one or more pnictogens. Such quantum dots can be formed from quantum dot precursors comprising one or more M donors and one or more X donors which are capable of reacting to form the desired semiconductor material. In certain embodiments, the M donor and the X donor can be moieties within the same molecule. The M donor can be an inorganic compound, an organometallic compound, or elemental metal. For example, an M donor can comprise cadmium, zinc, magnesium, mercury, aluminum, gallium, indium or thallium. The X donor can comprise a compound capable of reacting with the M donor to form a material with the general formula MX. Exemplary metal precursors include metal carboxylates. Exemplary metal precursors include dimethylcadmium, cadmium oleate and zinc oleate. The X donor can comprise a chalcogenide donor or source or a pnictide donor, such as a phosphine chalcogenide, a bis (silyl) chalcogenide, dioxygen, an ammonium salt, or a tris (silyl) pnictide. Suitable X donors include, for example, but are not limited to, dioxygen, bis(trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl) telluride ((TMS)$_2$Te), bis(trimethylsilyl)sulfide ((TMS)$_2$S), a trialkyl phosphine sulfide such as (tri-noctylphosphine) sulfide (TOPS), dialkyl phosphine selenide, aliphatic thiol, triethyl phosphine sulfide, tributyl phosphine sulfide, sulfuroctadecene, selenium-octadecene, an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A quantum dot can comprise one or more semiconductor materials. Examples of semiconductor materials that can be included in a quantum dot (including, e.g., a semiconductor nanocrystal) include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, an alloy including any of the foregoing, and/or a mixture including any of the foregoing, including ternary and quaternary mixtures or alloys. Examples of Group II elements include Zn, Cd, and Hg. Examples of Group VI elements include oxygen, sulfur, selenium and tellurium. Examples of Group III elements include boron, aluminum, gallium, indium, and thallium. Examples of Group V elements include nitrogen, phosphorus, arsenic, antimony, and bismuth. Examples of Group IV elements include silicon, germanium, tin, and lead.

A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain embodiments, quantum dots can comprise a core comprising one or more semiconductor materials and one or more shells comprising one or more semiconductor materials, wherein the shell is disposed over at least a portion, and preferably all, of the outer surface of the core. A quantum dot including a core and shell is also referred to as a "core/shell" structure.

For example, a quantum dot can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys. The X donor can comprise a chalcogenide donor where X is a chalcogenide including oxygen, sulfur, selenium, or tellurium, or mixtures thereof. Suitable chalcogenide donors include a reactive chalcogenide source, such as highly reactive chalcogenide sources such as (TMS)$_2$Se, (TMS)$_2$S, H$_2$S, chalcogenide mixtures such as octadecene-Se (ODE/Se), octadecene-S (ODE/S), amine-Se, amine-S and mixtures thereof and secondary phosphine chalcogenides such as a secondary phosphine sulfide, a secondary phosphine selenide, a secondary phosphine telluride, or a secondary phosphine oxide or mixtures thereof or dialkylphosphine chalcogenides such as diisobutylphosphine selenides, diisobutylphosphine sulfides, diphenylphosphine selenides or diphenylphosphine sulfides and the like or mixtures of any of the above.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, a shell or overcoating may comprise one or more layers. An overcoating can comprise at least one semiconductor material which is the same as or different from the composition of the core. Preferably, an overcoating has a thickness from about one to about ten monolayers. An overcoating can also have a thickness greater than ten monolayers. In certain embodiments, more than one overcoating can be included on a core. An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained. A particularly exemplary coating or layer or shell, such as for a core quantum dot, includes a Group II-VI semiconductor material. An example of a Group II-VI semiconductor material is zinc chalcogenide. One example of a Group II-VI zinc chalcogenide semiconductor material includes ZnS. Another example of a Group II-VI zinc chalcogenide semiconductor material includes ZnSe. One or more additional coatings or layers or shells can also be included in a core-shell quantum dot particle. An additional particularly exemplary coating includes Cd$_x$Zn$_{1-x}$S and further as a second coating over a first ZnS or ZnSe coating on a core quantum dot particle. In certain embodiments, the core particle can comprise a Group II-VI semiconductor material. In certain embodiments, the core particle can comprise a Group III-V semiconductor material. Core particles comprising other semiconductor materials can also be used.

In certain embodiments, the quantum dot particle includes a core and a first shell comprising zinc chalcogenide and at least a second shell comprising a second semiconductor material.

In certain embodiments, the first shell comprises a first semiconductor material and has a thickness greater than or equal to the thickness of 1 monolayer of the first semiconductor material.

In certain embodiments, the first shell has a thickness up to the thickness of about 20 monolayers of the first semiconductor material, for example, 1-20, 1-15, 5-20, 5-15, 8-20, and 8-15 monolayers. Other thicknesses within or outside these ranges may also be determined to be desirable.

In certain embodiments, the quantum dot can include a second shell. In certain of such embodiments, the second shell can comprise a second semiconductor material.

In certain embodiments wherein the quantum dot includes a second shell, the second shell can have a thickness greater than or equal to the thickness of 1 monolayer of the material from which it is constituted, e.g., the second semiconductor material. In certain of such embodiments, the second shell can have a thickness up to the thickness of about 25 monolayers, for example, 1-25, 1-22, 5-25, 5-22, 5-20, 8-25, 8-22, and 8-18. Other thicknesses within or outside these ranges may also be determined to be desirable.

As discussed above, a quantum dot particle may further optionally include one or more additional shells over the second shell.

In certain embodiments, the second shell and/or additional outer shell comprise a semiconductor material including one or more metals wherein the one or metals comprises from 0 up to 100% cadmium.

In certain embodiments, the second shell is the outer shell of the core-shell quantum dot particle.

In one example of a preferred embodiment, the quantum dot includes a core comprising CdSe, a first shell comprising zinc, sulfur, and selenium at a thickness of about 3-5 monolayers, and a second shell comprises Cd$_{1-x}$Zn$_x$S wherein 0<x<1 at a thickness of about 7-9 monolayers of Cd$_{1-x}$Zn$_x$S.

In certain preferred embodiments, the cadmium content of a shell comprising a semiconductor material represented by the formula Cd$_{1-x}$Zn$_x$S is from zero up to 100 mol % of the total Cd and Zn content. For example, the cadmium content can be 100 mole % (Zn content is zero), the cadmium content can be from zero up to 80 mol percent, from zero up to about 60 mol percent, from zero up to about 40 mol percent, from zero up to about 33 mol percent, from zero up to about 20 mol percent, from zero up to about 15 mol percent, from zero up to about 10 mol percent. In certain embodiments, the cadmium content is greater than zero.

According to a further aspect, a semiconductor nanocrystal can include a core semiconductor nanocrystal having an absence or substantial absence of amine species including one or more coatings or layers or shells of a same or different material formed in the absence or substantial absence of amine species to provide a core-shell quantum dot the is free or substantially free of amine species.

Examples of amine species preferably excluded from or substantially excluded from the method and quantum dots taught herein include, but are not limited to, amines, aliphatic primary amines such as oleyl amine, octylamine and the like, aliphatic secondary amines such as dioctyl amine and the like, aliphatic tertiary amines such as trioctylamine and the like, and aromatic amines or semiaromatic amines such as pyridine, imidazole and the like.

The shell can be chosen so as to have an atomic spacing close to that of the "core" substrate. Alternatively, the shell and core materials can have the same crystal structure.

Examples of a preferred quantum dot (semiconductor nanocrystal) of the present invention include a (core)shell1/shell2 structure: (CdZnSe)ZnSeS/CdZnS Methods of making quantum dot cores and quantum dots are known. One example of a method of making a quantum dot core (including, for example, but not limited to, a semiconductor nanocrystal) is a colloidal growth process. Colloidal growth occurs by injecting an M donor and an X donor into a hot coordinating solvent. One example of a preferred method for preparing monodisperse quantum dots comprises pyrolysis of organometallic reagents, such as dimethyl cadmium, injected into a hot, coordinating solvent. This permits discrete nucleation and results in the controlled growth of macroscopic quantities of quantum dots. The injection produces a nucleus that can be grown in a controlled manner to form a quantum dot. The reaction mixture can be gently heated to grow and anneal the quantum dot. Both the average size and the size distribution of the quantum dots in a sample are dependent on the growth temperature. The growth temperature for maintaining steady growth increases with increasing average crystal size. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a "size." Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

Another example of a method for making quantum dot cores and quantum dots comprising a semiconductor material that can be represented by the formula MX, wherein M represents one or more metals and X represents one or more chalcogens and/or one or more pnictogens, comprises combining precursors comprising one or more M donors and one or more X donors at a reaction temperature to form a reaction mixture. The reaction is then terminated or quenched. In certain aspects, an X donor can be added to a solution of a metal source or M donor at a reaction temperature to form a reaction mixture. The reaction is then terminated or quenched. In certain aspects, an M donor can be added to a solution of an X donor at a reaction temperature to form a reaction mixture. The reaction is then terminated or quenched. In certain aspects, an M donor and an X donor can be added to a reaction medium simultaneously. Preferably, the reaction is terminated or quenched so as to stop growth of the quantum dots before the quantum dots ripen or broaden or combine together. The reaction can be terminated or quenched, for example, by cooling the reaction mixture to a quenching temperature effective to terminate or quench the nucleation process in a manner to stop or limit further growth of the semiconductor nanocrystals. Preferably, the reaction mixture is cooled to a temperature effective to quench or stop growth of the semiconductor nanocrystals formed in the reaction mixture prior to ripening or broadening or combining of the quantum dots. After termination or quenching of the nucleation process to stop or limit growth prior to ripening, the quantum dots present in the reaction vessel may be subjected to further growth. Such additional growth can be carried out in the same reaction vessel, or the quantum dots can be transferred to a different reaction vessel without being isolated or recovered from the reaction mixture. Quantum dots present in the reaction vessel may, optionally, be isolated or recovered after quenching. Optionally, after isolation or recovery, the isolated or recovered quantum dots can be subjected to further growth by exposure to an M donor and an X donor. Further growth can include exposing the quantum dots (whether or not isolated or recovered) to an M donor and an X donor under suitable reaction conditions such that the quantum dots grow in size using the M donor and X donor. The M donor and the X donor can be provided to a reaction vessel including the quantum dots as a substantially steady or substantially constant infusion or feed or source such that as the M donor and the X donor are consumed or otherwise used to grow the quantum dots, additional supply of M donor and X donor are provided to the reaction vessel, such as in a substantially continuous manner, to continue growth of the quantum dots until a desired quantum dot core size or quantum dot size is reached.

According to colloidal methods of making quantum dots, the liquid medium can include solvents such as coordinating solvents. A coordinating solvent can help control the growth of the quantum dot. Alternatively, non-coordinating solvents can also be used in certain applications. A coordinating solvent is a compound having a donor lone pair, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, N-dodecylpyrrolidone (NDP) and hexyl octanoate. In certain embodiments, technical grade TOPO can be used. As will be appreciated by the skilled artisan, in aspects of the invention calling for the absence or substantial absence of amine species, use of amine-containing solvents are preferably avoided.

Preferably, reaction conditions are provided where amine based components in the reaction mixture are substantially completely reacted or otherwise used during the process such that free or unreacted or unbound amine species or byproducts thereof are absent or substantially absent in the reaction mixture when core quantum dots of desired size are obtained.

The narrow size distribution of the quantum dots (including, e.g., semiconductor nanocrystals) allows the possibility of light emission in narrow spectral widths. Monodisperse semiconductor nanocrystals have been described in detail in Murray et al. (J. Am. Chem. Soc., 115:8706 (1993)); in the thesis of Christopher Murray, entitled "Synthesis and Characterization of II-VI Quantum Dots and Their Assembly into 3-D Quantum Dot Superlattices", Massachusetts Institute of Technology, September, 1995. The foregoing are hereby incorporated herein by reference in their entireties.

The process of controlled growth and annealing of the quantum dots in the coordinating solvent that follows nucleation can also result in uniform surface derivatization and regular core structures. As the size distribution sharpens, the temperature can be raised to maintain steady growth. By adding more M donor or X donor, the growth period can be shortened. Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

Quantum dots (e.g., semiconductor nanocrystals) preferably further include ligands attached thereto. According to one aspect, quantum dots within the scope of the present invention include green CdSe quantum dots having oleic acid ligands and red CdSe quantum dots having oleic acid ligands. Alternatively, or in addition, octadecylphosphonic acid ("ODPA") ligands may be used instead of oleic acid ligands. The ligands promote solubility of the quantum dots in the polymerizable composition which allows higher loadings without agglomeration which can lead to red shifting.

Ligands can be derived from a coordinating solvent that may be included in the reaction mixture during the growth process. Ligands can be added to the reaction mixture. Ligands can be derived from a reagent or precursor included in the reaction mixture for synthesizing the quantum dots. Ligands can be exchanged with ligands on the surface of a quantum dot. In certain embodiments, quantum dots can include more than one type of ligand attached to an outer surface.

According to one aspect of the present invention, quantum dots described herein include aliphatic ligands attached thereto. Such aliphatic ligands promote adhesion with a carrier particle. Such aliphatic ligands promote solubility or dispersability of the quantum dots bound to the carrier particles in a curable or polymerizable matrix material. According to one aspect, exemplary ligands include fatty acid ligands, long chain fatty acid ligands, oleic acid ligands and octadecylphosphonic acid ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the quantum dots. In certain embodiments, quantum dots can include more than one type of ligand attached to an outer surface.

A quantum dot surface that includes ligands derived from the growth process or otherwise can be modified by repeated exposure to an excess of a competing ligand group (including, e.g., but not limited to, a coordinating group) to form an overlayer. For example, a dispersion of the capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the quantum dot, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium. Such affinity improves the stability of the suspension and discourages flocculation of the quantum dot. Examples of additional typical ligands include fatty acids, long chain fatty acids, oleic acid, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine, tri-n-octyl phosphine oxide, tris-hydroxylpropylphosphine, and octadecylphosphonic acid. Technical grade TOPO can be used. As will be appreciated by the skilled artisan, in aspects of the invention calling for the absence or substantial absence of amine species, use of amine-containing species as ligands are preferably avoided.

Suitable coordinating ligands can be purchased commercially or prepared by ordinary synthetic organic techniques.

According to an additional aspect, the surface of core quantum dots can be altered or supplemented or otherwise reconstructed using metal carboxylate species. This is particularly advantageous to remove amine species which may be bound to the core quantum dot. According to this aspect, it is desirable to utilize metal carboxylate species in the growth of first coatings and second coatings described herein.

According to a certain aspect, the use of carboxylate based precursors with small CdSe core quantum dots (less than 500 nm absorbance peak) to further grow the size of the quantum dots results in the surface of the quantum dots having a plurality of carboxylic acid ligands. According to this aspect, the Cd precursor may be carboxylate based including $Cd(Oleate)_2$ and the Se precursor may be dialkylphosphine-, dialkyloxyphosphine-, diarylphosphine-, or diaryloxyphosphine-selenide species such as diisobutylphosphine selenide or diphenylphosphine selenide. The growth process produces high quality monodisperse CdSe cores with a first absorbance peak tunable between 450-600 nm. The growth process allows in-situ high temperature overcoating of a first shell comprising a zinc, sulfur, and selenium. Further formation of a second shell comprising $Cd_xZn_{1-x}S$ (wherein $0<x<1$) can produce green emitters emitting between 500-540 nm with high solution quantum yield (QY) (about 80%), a FWHM of about 30 nm or less (e.g., about 25 nm or less) at room temperature and at a temperature of about 100° C. and high external quantum efficiency in the solid state (≥90-95% at room temperature and at a temperature of about 100° C.

In accordance with another aspect of the present invention, there is provided a method of making coated semiconductor nanocrystals, the method comprising: providing a first reaction mixture comprising core semiconductor nanocrystals in a solvent at a first temperature of greater than 240° C.; adding zinc carboxylate and a mixture of sulfur and selenium sources to the first reaction mixture including the core semiconductor nanocrystals to form first coated semiconductor nanocrystals; and adding one or more metal carboxylates and one or more chalcogenide sources to the first coated semiconductor nanocrystals at a second temperature of greater than 300° C. forming a second coating over the first coated semiconductor nanocrystals.

The first and second coatings are preferably formed in the absence or substantial absence of amine species.

According to an additional aspect, a method of making quantum dots having a coating thereon is provided which includes providing a reaction mixture of core quantum dots, rapidly injecting zinc carboxylate and a mixture of a sulfur source and a selenium source at a temperature of greater than 240° C. (e.g., but not limited to, at least 270° C., at least 280° C., at least 290° C., at least 300° C., or such other temperature as may be determined by the skilled artisan) for a period of time to form or complete a shell or layer or coating and/or to achieve a desired amount of alloying, such as, for example, 1 minute, 2 minutes, 5 minutes, 10 minutes, 15 minutes, 30 minutes, or such other time as may be determined by the skilled artisan to form a shell or layer or coating over the outer surfaces of the cores; providing a first coating, of desired thickness on the core quantum dots from the zinc carboxylate and mixture of sulfur and selenium sources. Thereafter, one or more metal carboxylate and one or more chalcogenide sources are added to the core quantum dots including the first coating at a temperature of greater than 300° C.; and providing a second coating on the first coated quantum dots from the one or more metal carboxylates and the one or more chalcogenide sources.

Preferably, as discussed above, both the first and second coating are prepared in the absence or substantial absence of amine species.

In certain embodiments, a dispersion of CdSe cores in a liquid medium are heated up to a first temperature greater than about 240° C. Zinc carboxylate (e.g., $Zn(Oleate)_2$) and a mixture of a sulfur source and a selenium source is introduced over a period of, for example, 15 minutes, as the temperature is maintained at about the first temperature. The amount of zinc, sulfur, and selenium introduced determine the thickness of the first shell. Zinc is preferably included in the reaction mixture in molar excess while the first shell is formed. At the end of the addition of the sulfur and selenium sources, the CdSe/ZnSeS core/shell material can be annealed (e.g., at a temperature between 320-330° C. for 5 minutes), upon which secondary shell precursors are infused over a preselected period of time at a preselected temperature. In certain embodiments, the temperature at which the second coating is formed can be at or about the temperature at which the first shell is annealed. At the end of the infusion of precursors for the second shell, the core/shell1/shell2 sample is preferably annealed (e.g., at a temperature of 320-330° C.). The reaction mixture can thereafter be cooled or otherwise returned to room temperature. The core/shell1/shell2 nanocrystals can thereafter be purified. In one particular example, the second shell precursors include $Cd(Oleate)_2$, $Zn(Oleate)_2$, and dodecanethiol. Preferably, such precursors are infused over a period of 30 minutes at a temperature held between 320-330° C.; at the end of the precursor infusion, the core/shell1/shell2 sample can be annealed for 5 minutes at 320-330° C., and cooled to room temperature for purification.

In one particular example, a first shell comprising ZnSSe can be prepared as follows. Quantum dot cores comprising cadmium selenide (CdSe) to be coated are added or injected into a reaction vessel that includes a solvent, preferably weakly coordinating or non-coordinating solvent (e.g., but not limited to octadecene (ODE)) that is at a first temperature of greater than about 240° C. (a first temperature of 280° C. can be preferred). A zinc carboxylate precursor (e.g., $Zn(Oleate)_2$) and a mixture of a sulfur source (e.g., but not limited to, dodecanethiol (DDT)) and a selenium source (e.g., but not limited to, diisobutylphosphine selenide (DIBPSe)) are injected, preferably rapidly and preferably at the same time, to the reaction mixture (which has continued to be heated at about the first temperature) to produce a first coating including zinc, sulfur, and selenium over the CdSe cores. The amount of the zinc carboxylate precursor added to the reaction vessel relative to the core can determine the number of monolayers of the first shell that can be formed. For example, the amount of sulfur and selenium precursors infused can be 0.3 and 0.3 equivalents, respectively, to the Zn in the zinc carboxylate precursor added to the reaction vessel, and this amount can be delivered, for example, in a controlled manner over a preselected period of time (e.g., 10 minutes at 280-320° C.).

The thickness of the first shell comprising ZnSSe can be varied from 1 monolayer (also abbreviated herein as "ML") to up to 20 ML. It is generally observed that a thicker first ZnSSe shell will produce a quantum dot with a narrower FWHM. However, as the thickness of the first shell exceeds 7-8 monolayers (MLs), the EQE may begin to suffer. In preferred embodiments, the first coating comprising zinc, sulfur, and selenium includes ~4 monolayers and the second coating (e.g., comprising cadmium, zinc, and sulfur) includes ~8 monolayers and can provide quantum dots with an EQE of about 90% or above and <1% EQE drop at 140° C., and FWHM of about 30 nm or less.

An example of a preferred second coating comprises $Cd_{1-x}Zn_xS$ (wherein $0<x<1$) which can be added after the first shell. The second coating or shell is preferably formed after the first shell in an in situ fashion (e.g., without isolation of the particle prior to formation of the additional shell). For example, a cadmium precursor (e.g., $Cd(Oleate)_2$) and zinc precursor (e.g., $Zn(Oleate)_2$) are mixed at varying proportions, from greater than 0% Cd to 100% Cd. The sulfur precursor is preferably a long-chain aliphatic thiol, such as dodecanethiol.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibiting less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as between 0% to greater than 95%, for example in solution, such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

Quantum dots in accordance with the present invention can be used with quantum dots that emit wavelengths characteristic of red light and a blue light source to create trichromatic white light. In such application, quantum dots capable of emitting red light emit light having a peak center wavelength in a range from about 615 nm to about 635 nm, and any wavelength in between whether overlapping or not, can be desirable. For example, the red-emitting quantum dots can emit light with a peak center wavelength of about 630 nm, of about 625 nm, of about 620 nm, or of about 615 nm.

Quantum dots in accordance with the present invention can emit green light emit light having a peak center wavelength in a range from about 520 nm to about 545 nm, and any wavelength in between whether overlapping or not. For example, the quantum dots in accordance with the present invention can emit green light with a peak center wavelength of about 520 nm, of about 525 nm, of about 535 nm, or of about 540 nm.

According to further aspects of the present invention, the green emitting quantum dots described herein exhibit a narrow emission profile of about 30 nm or less at full width half maximum (FWHM) at room temperature (e.g., about 25° C.) and at about 100° C. The narrow emission profile of quantum dots of the present invention allows the tuning of mixtures of quantum dots to emit saturated colors thereby increasing color gamut and power efficiency beyond that of conventional LEDs and LED lighting displays. According to one aspect, green quantum dots in accordance with the present invention that are designed to emit a predominant wavelength of, for example, about 523 nm can be combined, mixed or otherwise used in combination with red quantum dots designed to emit a predominant wavelength of about, for example, 617 nm and having an narrow emission profile with a FWHM of about, for example about 30 nm or less. Such combinations can be stimulated by blue light to create trichromatic white light.

Quantum dots in accordance with the present invention can be included in various formulations depending upon the desired utility. According to one aspect, quantum dots are included in flowable formulations or liquids to be included, for example, into clear vessels which are to be exposed to light. Such formulations can include various amounts of one or more type of quantum dots and one or more host materials. Such formulations can further include one or more scatterers. Other optional additives or ingredients can also be included in a formulation. In certain embodiments, a formulation can further include one or more photo initiators. One of skill in the art will readily recognize from the present invention that additional ingredients can be included depending upon the particular intended application for the quantum dots.

An optical material, other composition, or formulation within the scope of the invention may include a host material, such as in the case of an optical component, which may be present, for example, in an amount from about 50 weight percent and about 99.5 weight percent, and any weight percent in between whether overlapping or not. In certain embodiment, a host material may be present in an amount from about 80 to about 99.5 weight percent. Examples of specific useful host materials include, but are not limited to, polymers, oligomers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like. Other suitable host materials can be identified by persons of ordinary skill in the relevant art.

Host materials can also comprise silicone materials. Suitable host materials comprising silicone materials can be identified by persons of ordinary skill in the relevant art.

In certain embodiments and aspects of the inventions contemplated by this invention, a host material comprises a photocurable resin. A photocurable resin may be a preferred host material in certain embodiments, e.g., in embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the inventions contemplated by this invention, a host material can comprise a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Quantum dots can be encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and U.S. Patent Application No. 61/240,932 of Nick et al., filed 9 Sep. 2009 entitled "Particles Including Nanoparticles, Uses Thereof, And Methods", each of the foregoing being hereby incorporated herein by reference in its entirety.

The total amount of quantum dots included in an optical material, such as a host material for example a polymer matrix, within the scope of the invention is preferably in a range from about 0.05 weight percent to about 5 weight percent, and any weight percent in between whether overlapping or not. The amount of quantum dots included in an optical material can vary within such range depending upon the application and the form in which the quantum dots are included (e.g., film, optics (e.g., capillary), encapsulated film, etc.), which can be chosen based on the particular end application. For instance, when an optic material is used in a thicker capillary with a longer pathlength (e.g., such as in a backlight unit (BLU) for large screen television applications), the concentration of quantum dots can be closer to 0.5%. When an optical material is used in a thinner capillary with a shorter pathlength (e.g., such as in BLUs for mobile or hand-held applications), the concentration of quantum dots can be closer to 5%.

The quantum dots used in a formulation, optical material, or other composition are selected based on the desired peak emission wavelength or combinations of wavelengths described for the particular intend end-use application for the formulation, optical material, or other composition.

When quantum dots emit light with peak emission wavelengths that differ from that of other quantum dots included in a particular embodiments, the amounts of each are selected based on the desired light out-put. Such determination can be readily made by the person of ordinary skill in the relevant art. For example, the ratio of quantum dots with different peak emissions that are used in an optical material is determined by the emission peaks of the quantum dots used. For example, when quantum dots capable of emitting green light having a peak center wavelength in a range from about 514 nm to about 545 nm, and any wavelength in between whether overlapping or not, and quantum dots capable of emitting red light having a peak center wavelength in a range from about 615 nm to about 645 nm, and any wavelength in between whether overlapping or not, are used in an optical material, the ratio of the weight percent green-emitting quantum dots to the weight percent of red-emitting quantum dots can be in a range from about 12:1 to about 1:1, and any ratio in between whether overlapping or not.

The above ratio of weight percent green-emitting quantum dots to weight percent red-emitting quantum dots in an optical material can alternatively be presented as a molar ratio. For example, the above weight percent ratio of green to red quantum dots can correspond to a green to red quantum dot molar ratio in a range from about 24.75 to 1 to about 5.5 to 1, and any ratio in between whether overlapping or not.

The ratio of the blue to green to red light output intensity in white trichromatic light emitted by a quantum dot containing BLU described herein including blue-emitting solid state inorganic semiconductor light emitting devices (having blue light with a peak center wavelength in a range from about 450 nm to about 460 nm, and any wavelength in between whether overlapping or not), and an optical material including mixtures of green-emitting quantum dots and red-emitting quantum dots within the above range of weight percent ratios, can vary within the range. For example, the ratio of blue to green light output intensity therefor can be in a range from about 0.75 to about 4 and the ratio of green to red light output intensity therefor can be in a range from about 0.75 to about 2.0. In certain embodiments, for example, the ratio of blue to green light output intensity can be in a range from about 1.4 to about 2.5 and the ratio of green to red light output intensity can be in a range from about 0.9 to about 1.3.

Scatterers, also referred to as scattering agents, within the scope of the invention may be present, for example, in an amount of between about 0.01 weight percent and about 1 weight percent. Amounts of scatterers outside such range may also be useful. Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO, which are non-luminescent. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the relevant art. The size and size distribution can be based upon the refractive index mismatch of the scattering particle and the host material in which the light scatterers are to be dispersed, and the preselected wavelength(s) to be scattered according to Rayleigh or Mie scattering theory. The surface of the scattering particle may further be treated to improve dispersability and stability in the host material. In one embodiment, the scattering particle comprises $TiO_2$ (R902+ from DuPont) of 0.2 µm particle size, in a concentration in a range from about 0.01 to about 1% by weight.

The amount of scatterers in a formulation is useful in applications where the formulation which may be in the form of an ink is contained in a clear vessel having edges to limit losses due the total internal reflection. The amount of the scatterers may be altered relative to the amount of quantum dots used in the formulation. For example, when the amount of the scatter is increased, the amount of quantum dots may be decreased.

Examples of thixotropes which may be included in a quantum dot formulation, also referred to as rheology modifiers, include, but are not limited to, fumed metal oxides (e.g., fumed silica which can be surface treated or untreated (such as Cab-O-Sil® fumed silica products available from Cabot Corporation)) or fumed metal oxide gels (e.g., a silica gel). An optical material can include an amount of thixotrope in a range from about 5 to about 12 weight percent. Other amounts outside the range may also be determined to be useful or desirable.

In certain embodiments, a formulation including quantum dots and a host material can be formed from an ink comprising quantum dots and a liquid vehicle, wherein the liquid vehicle comprises a composition including one or more functional groups or units that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

One particular example of a preferred method of making an ink is as follows. A solution including quantum dots having the desired emission characteristics well dispersed in an organic solvent is concentrated to the consistency of a wax by first stripping off the solvent under nitrogen/vacuum until a quantum dot containing residue with the desired consistency is obtained. The desired resin monomer is then added under nitrogen conditions, until the desired monomer to quantum dot ratio is achieved. This mixture is then vortex mixed under oxygen free conditions until the quantum dots are well dispersed. The final components of the resin are then added to the quantum dot dispersion, and are then sonicated mixed to ensure a fine dispersion.

A tube or capillary comprising an optical material prepared from such finished ink can be prepared by then introducing the ink into the tube via a wide variety of methods, and then UV cured under intense illumination for some number of seconds for a complete cure.

In certain aspects and embodiments of the inventions taught herein, the optic including the cured quantum dot containing ink is exposed to light flux for a period of time sufficient to increase the photoluminescent efficiency of the optical material.

In certain embodiments, the optical material is exposed to light and heat for a period of time sufficient to increase the photoluminescent efficiency of the optical material.

In preferred certain embodiments, the exposure to light or light and heat is continued for a period of time until the photoluminescent efficiency reaches a substantially constant value.

In one embodiment, for example, after the optic, i.e. tube or capillary, is filled with quantum dot containing ink, cured, and sealed (regardless of the order in which the curing and sealing steps are conducted), the optic is exposed, to 25-35 mW/cm$^2$ light flux with a wavelength in a range from about 365 nm to about 470 nm, while at a temperature in a range from about 25 to 80° C., for a period of time sufficient to increase the photoluminescent efficiency of the ink. In one embodiment, for example, the light has a wavelength of about 450 nm, the light flux is 30 mW/cm$^2$, the temperature 80° C., and the exposure time is 3 hours.

In general, quantum dots according to the present invention can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 nm to about 20 nm or about 1 nm to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added drop wise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

According to one aspect, a formulation or composition includes a host material that is photopolymerizable. The formulation or composition in the form of a fluid can be placed within the tube or other container and then one or both ends sealed with the tube being hermetically sealed to avoid oxygen being within a tube. Alternatively, the formulation or composition can be disposed between opposing plates and/or sheets with the perimeter edges being hermetically sealed. Quantum dots may be present in the polymerizable composition in an amount from about 0.05% w/w to about 5.0% w/w. According to one aspect, the polymerizable composition is photopolymerizable. The polymerizable composition is in the form of a fluid which can be placed within the tube and then one or both ends sealed with the tube being hermetically sealed to avoid oxygen being within the tube. The polymerizable composition is then subjected to light of sufficient intensity and for a period of time sufficient to polymerize the polymerizable composition, and in one aspect, in the absence of oxygen. In certain embodiments, the period of time can range between about 10 seconds to about 6 minutes or between about 1 minute to about 6 minutes. According to one embodiment, the period of time is sufficiently short to avoid agglomeration of the quantum dots prior to formation of a polymerized matrix. Agglomeration can result in FRET and subsequent loss of photoluminescent performance.

A host material can include a combination of one or more polymerizable host materials. A polymer or matrix in which quantum dots are dispersed is an example of a host material. Host materials include polymeric and non-polymeric materials that are at least partially transparent, and preferably fully transparent, to preselected wavelengths of light.

According to an additional aspect, a polymerizable host material is selected so as to provide sufficient ductility to the polymerized matrix. Ductility can be advantageous in relieving stress on thin walled glass tubes that can occur during polymer shrinkage when the polymer matrix is cured. Suitable polymerizable materials can act as solvents for the quantum dots and so combinations of polymerizable host materials can be selected based on solvent properties for various quantum dots.

Polymerizable host materials include monomers and oligomers and polymers and mixtures thereof. Exemplary monomers include lauryl methacrylate, norbornyl methacrylate, Ebecyl 150 (Cytec), CD590 (Cytec) and the like. Polymerizable materials can be present in the polymerizable formulation in an amount greater than 50 weight percent. Examples include amounts in a range greater than 50 to about 99.5 weight percent, greater than 50 to about 98 weight percent, greater than 50 to about 95 weight percent, from about 80 to about 99.5 weight percent, from about 90 to about 99.95 weight percent, from about 95 to about 99.95 weight percent. Other amounts outside these examples may also be determined to be useful or desirable.

Exemplary polymerizable compositions further include one or more of a crosslinking agent, a scattering agent, a rheology modifier, a filler, and a photoinitiator.

Suitable crosslinking agents include ethylene glycol dimethacrylate Ebecyl 150 and the like. Crosslinking agents can be present in the polymerizable formulation in an amount between about 0.5 wt % and about 3.0 wt %. Crosslinking agents are generally added, for example in an amount of 1% w/w, to improve stability and strength of a polymer matrix which helps avoid cracking of the matrix due to shrinkage upon curing of the matrix.

Suitable scattering agents include $TiO_2$, alumina, barium sulfate, PTFE, barium titanate and the like. Scattering agents can be present in the polymerizable formulation in an amount between about 0.05 wt % and about 1.0 wt %. Scattering agents are generally added, for example in a preferred amount of about 0.15% w/w, to promote outcoupling of emitted light.

Suitable rheology modifiers (thixotropes) include fumed silica commercially available from Cabot Corporation such as TS-720 treated fumed silica, treated silica commercially available from Cabot Corporation such as TS720, TS500, TS530, TS610 and hydrophilic silica such as M5 and EHS commercially available from Cabot Corporation. Rheology modifiers can be present in the polymerizable formulation in an amount between about 5% w/w to about 12% w/w. Rheology modifiers or thixotropes act to lower the shrinkage of the matrix resin and help prevent cracking. Hydrophobic rheology modifiers disperse more easily and build viscosity at higher loadings allowing for more filler content and less shrinkage to the point where the formulation becomes too viscous to fill the tube. Rheology modifiers such as fumed silica also provide higher EQE and help to prevent settling of $TiO_2$ on the surface of the tube before polymerization has taken place.

Suitable fillers include silica, fumed silica, precipitated silica, glass beads, PMMA beads and the like. Fillers can be present in the polymerizable formulation in an amount between about 0.01% and about 60%, about 0.01% and about 50%, about 0.01% and about 40%, about 0.01% and about 30%, about 0.01% and about 20% and any value or range in between whether overlapping or not.

Suitable photoinitiators include Irgacure 2022, KTO-46 (Lambert), Esacure 1 (Lambert) and the like. Photoinitiators can be present in the polymerizable formulation in an amount between about 1% w/w to about 5% w/w. Photoinitiators generally help to sensitize the polymerizable composition to UV light for photopolymerization.

Additional information that may be useful in connection with the present invention and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; International Application No. PCT/US2008/007901 of Linton et al, filed 25 Jun. 2008 entitled "Compositions And Methods Including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2012/066145 of QD Vision, Inc., filed 20 Nov. 2012 entitled "Methods For Coating Semiconductor Nanocrystals, Semiconductor Nanocrystals, And Products Including Same"; International Application No. PCT/US2012/066149 of QD Vision, Inc., filed 20 Nov. 2012 entitled "Stress-Resistant Component For Use With Quantum Dots"; International Application No. PCT/US2012/066151 of QD Vision, Inc., filed 20 Nov. 2012 entitled "Quantum Dot-Containing Compositions Including an Emission Stabilizer, Products Including Same, And Method"; International Application No. PCT/US2012/066140 of QD Vision, Inc., filed 20 Nov. 2012 entitled "Method Of Making Quantum Dots", each of the foregoing being hereby incorporated herein by reference in its entirety.

In accordance with a still further aspect of the present invention, there is provided a composition including at least one quantum dot described herein. The composition can further include a host material, e.g., but not limited to, a host material described herein. Other additives can optionally be further included based upon the intended end-use application.

In accordance with a still further aspect of the present invention, there is provided an optical material comprising at least one quantum dot described herein. The optical material can further include a host material, e.g., but not limited to, a host material described herein. Other additives can optionally be further included based upon the intended end-use application.

In accordance with a still further aspect of the present invention, there is provided a light emitting material comprising at least one quantum dot described herein. The light-emitting material can further include a host material, e.g., but not limited to, a host material described herein.

Other additives can optionally be further included based upon the intended end-use application.

In accordance with a still further aspect of the present invention, there is provided an optical component including at least one quantum dot described herein.

In accordance with a still further aspect of the present invention, there is provided a backlighting unit including at least one quantum dot described herein.

In accordance with a still further aspect of the present invention, there is provided a display including at least one quantum dot described herein.

In accordance with a still further aspect of the present invention, there is provided a light-emitting device including at least one quantum dot described herein.

In accordance with yet another aspect of the present invention, there is provided a population of quantum dots including at least on quantum dot described herein. In accordance with yet another aspect of the present invention, there is provided a population of quantum dots prepared in accordance with any of the methods described herein. In accordance with a still further aspect of the present invention, there is provided a composition including at least one quantum dot prepared in accordance with any of the methods described herein. The composition can further include a host material, e.g., but not limited to, a host material described herein. Other additives can optionally be further included based upon the intended end-use application.

In accordance with a still further aspect of the present invention, there is provided an optical material comprising at least one quantum dot prepared in accordance with any of the methods described herein. The optical material can further include a host material, e.g., but not limited to, a host material described herein. Other additives can optionally be further included based upon the intended end-use application.

In accordance with a still further aspect of the present invention, there is provided a light emitting material comprising at least one quantum dot prepared in accordance with any of the methods described herein. The light emitting material can further include a host material, e.g., but not limited to, a host material described herein. Other additives can optionally be further included based upon the intended end-use application.

In accordance with a still further aspect of the present invention, there is provided an optical component including at least one quantum dot prepared in accordance with any of the methods described herein.

In accordance with a still further aspect of the present invention, there is provided a backlighting unit including at least one quantum dot prepared in accordance with any of the methods described herein.

In accordance with a still further aspect of the present invention, there is provided a display including at least one quantum dot prepared in accordance with any of the methods described herein.

In accordance with a still further aspect of the present invention, there is provided a light-emitting device including at least one quantum dot prepared in accordance with any of the methods described herein.

In various aspects and embodiments of the inventions described herein, the quantum dot core and shells are undoped.

In various aspects and embodiments of the inventions described herein, a quantum dot described herein can be included in a device, component, or product, optionally in the form of a composition in which it is included.

The present invention will be further clarified by the following examples, which are intended to be exemplary of the present invention.

Example I

Coating Core Quantum Dots Using a Coating Process

Synthesis of CdSe Cores:

The following were added to a 1 L steel reaction vessel: trioctylphosphine oxide (36.99 g), 1-octadecene (120.13 g), 1-octadecylphosphonic acid (23.59 g, 70.54 mmol), and $Cd(Oleate)_2$ (1M solution in trioctylphosphine, 70.18 mL, 70.18 mmol). The vessel was subjected to 3 cycles of vacuum/nitrogen at 120° C., and the temperature was raised to 270° C. under nitrogen. At 270° C., a solution of 1M diisobutylphosphine selenide in N-dodecylpyrrolidone (DIBP-Se, 52.26 g, 55.02 mmol) was rapidly injected, within a period of less than 1 second, followed by injection of 1-octadecene (45.26 g) to rapidly drop the temperature to about 240° C. resulting in the production of quantum dots with an initial absorbance peak between 420-430 nm. 5-20 seconds after the ODE injection, a solution of $Cd(oleate)_2$ (0.5M in a 50/50 v/v mixture of TOP and ODE) was continuously introduced along with a solution of DIBP-Se (0.4M in a 60/40 v/v mixture of N-dodecylpyrrolidone and ODE) at a rate of 5.18 mL/min. A total of 37.5 mL of each precursor was delivered while the temperature of the reactor was maintained between 205-240° C. At the end of the infusion, the reaction vessel was cooled rapidly by immersing the reactor in a squalane bath chilled with liquid nitrogen to rapidly bring the temperature down to <150° C. (within 2 minutes). The final material was used as is without further purification (First absorbance peak: 485 nm, Total volume: 687.78 mL, Reaction yield: 99%).

Synthesis of CdSe/ZnSeS/CdZnS Core-Shell Nanocrystals:

3.65 mL of 1-octadecene (ODE) is loaded into a 50 mL reaction flask and degassed at 110 C for 30 min. The flask is put under $N_2$ pressure and heated up to 280° C., at which a solution of ODE (0.61 mL) and CdSe cores (0.3 mL, 0.25 mmol Cd) is rapidly injected. A mixture of two solutions is simultaneously infused over a period of 10 min at 285° C. Infusion solution 1 consists of a solution of Zn(Oleate) (0.84 mL, 0.5M) in tri-n-ctylphosphine (TOP). Infusion solution 2 consists of DIBP-Se (0.11 mL, 1M), dodecanethiol (0.03 mL), and ODE (0.69 mL). After 10 minutes the solution is allowed to anneal for 5 minutes and the temperature set to ramp to 330° C. over approximately 5 minutes. During this ramp, a second set of precursors are infused. Infusion solution 1 consists of a mixture of Cd(Oleate) (1.0M in TOP, 0.55 mL) and Zn(Oleate) (0.5M in TOP, 6.28 mL in TOP). Infusion solution 2 consists of a mixture of dodecanethiol (2.42 mL), ODE (3.53 mL) and TOP (0.88 mL). The two precursors are infused over 15 min with a max temperature of 320 C. After 15 min, the solution is allowed to cool under passive cooling to room temperature. The resulting core-shell material is precipitated out of the growth solution inside a nitrogen atmosphere glovebox by adding a 2:1 mixture of butanol and methanol. The isolated quantum dots (QDs) are then dissolved in toluene and precipitated a second time using 2:3 butanol:methanol. The QDs are finally dispersed in toluene. The isolated material specifications are as follows: First absorbance peak=511 nm; Emission=528 nm; FWHM=25.7 nm; Film EQE=96% (Room Temperature (e.g., about 25° C.).; Film EQE @140° C.=93%. See FIG. 1 for the sample emission spectrum.

Example II

Preparation of Ink Composition & Films

The following describes preparation of an ink formulation including semiconductor nanocrystals and preparation of a film from such ink formulation.

Example IIA

Preparation of Ink Formulation 10 mg of semiconductor nanocrystals (inorganic mass as determined via thermal gravimetric analysis (TGA)) in toluene is added to 1.0 mL of Ebecyl 150 and degassed under reduced pressure to remove the toluene and oxygen. Once the toluene is removed, three purge and $N_2$ back-fill cycles are completed and then 10 mg of $TiO_2$ (1% by weight) is added to the formulation and the mixture is degassed under reduced pressure while stirring in order to disperse the $TiO_2$. (this step is no longer conducted) The formulation is then ready for film preparation.

Example IIB

Preparation of Film

A film prepared from an ink formulation prepared as generally described in Example IIA is prepared as follows. ~5-10 µL of the formulation is dropped onto a 15 mm diameter borosilicate glass disc (~230+/−20 um in thickness). A second 15 mm disk is set on top of the drop of formulation sandwiching the ink between the glass slides. Care is taken to minimize the amount of ink at the edges that is not completely sandwiched by the glass slides. The sandwich is then brought into a $N_2$ purge box and inserted into a UV curing station (Dymax 5000-EC Series UV Curing Flood Lamp System) and cured with the following curing conditions: Dymax Metal Halide "D" Bulb; Part #38560; 80-100 milliWatt (mW)/square centimeter ($cm^2$) excitation power with a cure time of 10 seconds. (Without the Irgacure 2022, this step is not necessary) After this process, the EQE of the film is measured in a QEMS (Labsphere product) integrating sphere system. The films are then ready for temperature dependent efficiency measurements.

Example IIC

Photoluminescence (PL) Vs. Temperature Measurement Protocol

With the room temperature (25° C.) EQE measured in an integrating sphere (Example IIB), the sample is then measured on a hotplate at room temperature. The measurement involves optically exciting the sample at a wavelength shorter than the band edge absorption of the QDs (i.e. 1st excitonic absorption feature) and collecting both a portion of the PL emission from the sample. The sample temperature is then raised via the hotplate and equilibrated at an elevated temperature for ~1 min (the temperature should not rise slower than 10° C./min) and the PL of the sample is then measured again. This process is repeated for one or more temperatures between 25° C. and about 140° C. or above. Measurements can be at preselected temperature intervals, e.g., at every 5, 10, or 20 degree intervals. Other intervals can be selected. For each data point, the sample is held at a given temperature for about <~1-2 minutes when PL is measured. The EQE measurements were made using a 440 nm laser light source. Other adequate light sources include 405 nm laser or blue (405 and 440-450 nm) LED light sources. Monochromatic light from a white light monochromator can also be used. The light source should excite the sample with a flux/power density no greater than 100 $mW/cm^2$. Preferably, the excitation power density used to measure the sample is lower than that used to expose the sample prior to room temperature EQE measurement (as described in preparation of the film, Example IIB). The optical path of the system (both excitation light and emitted semiconductor nanocrystal light) is not altered during data collection.

Example III

PL Vs. Temperature

The PL data shown in Table A (below) are based on sample films prepared with the semiconductor nanocrystals of the invention (the film being prepared as generally described in Example II) with nanocrystals prepared generally in accordance with the procedure described in Examples I. (In the table, CWL refers to peak center wavelength.)

Table A summarizes the sample PL for Example I as a function of temperature. The data presented in Table A are calculated based on the integrated PL change with temperature. Since the integrated PL is directly proportional to the EQE of the sample, the change in PL as function of temperature will be equivalent to the % change in EQE (understanding there can be small changes in the absorption at elevated temperatures; which is <5% up to 140° C.).

TABLE A

| Temp. (C.) | CWL (nm) | Heating PL Intensity | FWHM | CWL (nm) | Cooling PL Intensity | FWHM |
|---|---|---|---|---|---|---|
| 25 | 532.0 | 100.0 | 24.0 | 532.9 | 99.1 | 25.1 |
| 100 | 540.0 | 97.8 | 27.0 | 540.0 | 96.8 | 27.0 |
| 140 | 544.0 | 96.9 | 29.0 | 544.0 | 96.7 | 29.0 |

% Difference in PL with Temperature increase from 25° C. to 140° C. = 3.06

Figure 2:
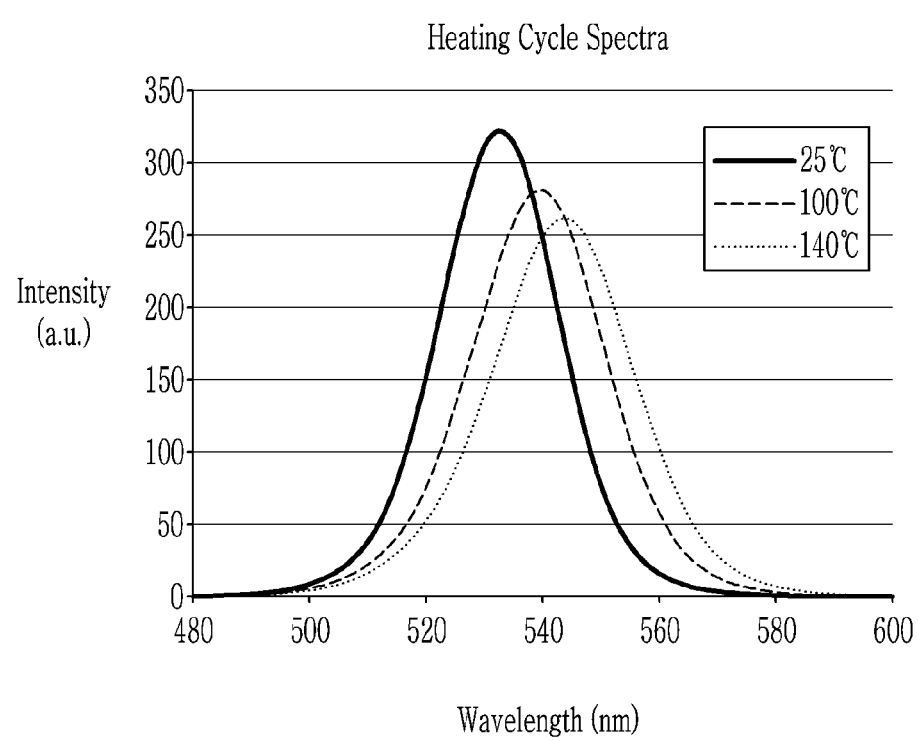
FIG. 2 graphically depicts heating cycle spectra for Example 1 at various temperatures.

FIG. 2 graphically depicts the emission spectra taken during collection of the PL v. Temperature data summarized in Table A.

While not wishing to be bound by theory, this illustrates a reduction in the quenching of semiconductor nanocrystal emission as a function of temperature (also referred to as "thermal quenching".)

For assessing the EQE vs. temperature response of a semiconductor nanocrystal sample, a relative EQE measurement can be performed whereby the $\Sigma^{PL}$ values can be correlated back to the room temperature or starting EQE (EQE can be measured using DeMello's method in an integrating sphere). In other words, the $\Sigma^{PL}$ at room temp is set equal to the room temp EQE, and then the % drop in $\Sigma^{PL}$ at elevated temperatures, equates to an equivalent % drop from the room temperature EQE value. ($\Sigma^{PL}$ at RT is also referred to herein as Io, and $\Sigma^{PL}$ at temperature T is also referred to herein as I(T).)

"Solid state external quantum efficiency" (which may also be referred to herein as "EQE" or "solid state photoluminescence external quantum efficiency") can be measured in a 12" integrating sphere using a NIST traceable calibrated light source, using the method developed by deMello et al., Advanced Materials 9(3):230 (1997), which is hereby incorporated by reference. Such measurements can also be made with a QEMS from LabSphere (which utilizes a 4 in sphere; e.g. QEMS-2000: World Wide Website laser2000.nl/upload/documenten/fop_21-en2.pdf).

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A light emitting device comprising an optical material comprising semiconductor nanocrystals and a host material in which the semiconductor nanocrystals are dispersed; wherein the semiconductor nanocrystal comprises a core having a first shell over at least a portion of the outer surface of the core; wherein the first shell comprises a Group IIB element and at least two Group VIA elements; and wherein semiconductor nanocrystals emit green light having a peak emission with a full width at half maximum of about 30 nm or less at about 25° C. and at about 100° C.

2. The light emitting device as claimed in claim 1, wherein the semiconductor nanocrystal has a solid state external quantum efficiency of at least 90% at a temperature of 90° C. or above.

3. The light emitting device as claimed in claim 2, wherein the semiconductor nanocrystal has a solid state external quantum efficiency of at least 95% at a temperature of 90° C. or above.

4. The light emitting device as claimed in claim 1, wherein the full width at half maximum at 100° C. is about 25 nm or less.

5. The light emitting device as claimed in claim 1, further comprising a second shell over at least a portion of the outer surface of the first shell.

6. The light emitting device as claimed in claim 1, wherein the core comprises a Group IIB element and a Group VI B element.

7. The light emitting device as claimed in claim 1, wherein the core comprises cadmium and selenium.

8. The light emitting device as claimed in claim 1, wherein the first shell comprises a Group FIB element and a Group VIA element.

9. The light emitting device as claimed in claim 5, wherein the first shell comprises zinc, sulfur, and selenium.

10. The light emitting device as claimed in claim 5, wherein the second shell comprises a Group IIB element and a Group VIA element.

11. The light emitting device as claimed in claim 5, wherein the second shell comprises cadmium, zinc, and sulfur.

12. The light emitting device as claimed in claim 5, wherein the core comprises cadmium and selenium, the first shell comprises zinc, sulfur, and selenium, and the second shell comprises cadmium, zinc, and sulfur.

13. The light emitting device as claimed in claim 5, wherein the first shell has a thickness of about 3 monolayers to about 7 monolayers, and the second shell has a thickness of about 7 monolayers to about 9 monolayers.

14. The light emitting device as claimed in claim 1, wherein the optical material is in a shape of a film.

15. The light emitting device as claimed in claim 1, wherein the host material comprises at least one selected from a polymer, oligomer, monomer, resin, binder, glass, and a metal oxide.

16. The light emitting device as claimed in claim 15, wherein the host material comprises at least one selected from a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, and a copolymer containing monomer or oligomer forming the foregoing resins.

17. The light emitting device as claimed in claim 1, wherein the amount of the semiconductor nanocrystals included in the optical material is in a range from about 0.05 wt % to about 5 wt %.

18. A display including the emitting device in accordance with claim 1.

19. A backlight unit including the light emitting device in accordance with claim 1.

* * * * *